(12) United States Patent
Kim et al.

(10) Patent No.: US 7,345,359 B2
(45) Date of Patent: Mar. 18, 2008

(54) INTEGRATED CIRCUIT PACKAGE WITH CHIP-SIDE SIGNAL CONNECTIONS

(75) Inventors: Joong-Ho Kim, Phoenix, AZ (US); Dong-Ho Han, Phoenix, AZ (US); Hyunjun Kim, Chandler, AZ (US); Jiangqi He, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 47 days.

(21) Appl. No.: 10/795,072

(22) Filed: Mar. 5, 2004

(65) Prior Publication Data

US 2005/0194669 A1    Sep. 8, 2005

(51) Int. Cl.
*H01L 23/02* (2006.01)

(52) U.S. Cl. .................. 257/678; 257/686; 257/712; 257/730; 257/E23.178

(58) Field of Classification Search ............. 257/678, 257/E23.178
See application file for complete search history.

(56) References Cited

U.S. PATENT DOCUMENTS

| 5,410,451 | A  | * | 4/1995  | Hawthorne et al. | 361/760 |
|-----------|----|---|---------|------------------|---------|
| 6,008,988 | A  |   | 12/1999 | Palmer           |         |
| 6,469,909 | B2 | * | 10/2002 | Simmons          | 361/803 |
| 6,472,735 | B2 | * | 10/2002 | Isaak            | 257/686 |
| 6,797,891 | B1 |   | 9/2004  | Blair et al.     |         |
| 6,979,891 | B2 | * | 12/2005 | Wood et al.      | 257/679 |
| 7,014,472 | B2 | * | 3/2006  | Fjelstad et al.  | 439/65  |
| 7,078,794 | B2 | * | 7/2006  | Lee              | 257/687 |
| 7,091,586 | B2 | * | 8/2006  | Millik et al.    | 257/685 |
| 7,120,031 | B2 | * | 10/2006 | Chakravorty et al. | 361/762 |
| 2004/0022038 | A1 | * | 2/2004 | Figueroa et al.  | 361/763 |
| 2004/0027813 | A1 | * | 2/2004 | Li               | 361/767 |
| 2004/0218372 | A1 | * | 11/2004 | Hamasaki et al. | 361/767 |

* cited by examiner

*Primary Examiner*—Kenneth Parker
*Assistant Examiner*—José R. Diaz
(74) *Attorney, Agent, or Firm*—Schwabe, Williamson & Wyatt, P.C.

(57) ABSTRACT

Embodiments of the present invention include an apparatus, method, and/or system for an integrated circuit package with signal connections on the chip-side of the package structure.

11 Claims, 4 Drawing Sheets

INTEGRATED CIRCUIT PACKAGE WITH CHIP-SIDE SIGNAL CONNECTIONS

FIELD OF THE INVENTION

The present invention relates to integrated circuit packages, and more particularly, but not limited to, providing an electrical connection to the integrated circuit through the chip-side of the package structure.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF ILLUSTRATIVE EMBODIMENTS

In the following detailed description, numerous specific details are set forth in order to provide a thorough understanding of embodiments of the present invention. However, those skilled in the art will understand that such embodiments may be practiced without these specific details. In other instances, well-known methods, procedures, and components have not been described in detail.

Although various discrete operations will be described herein, the mere order of description should not be construed as to imply that these operations are necessarily performed in the order they are presented.

Reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment or invention. Furthermore, the particular features, structures, or characteristics may be combined in any suitable manner in one or more embodiments. Lastly, the terms "comprising", "including", "having", and the like, as used in the present specification, are intended to be synonymous.

Figure 1:
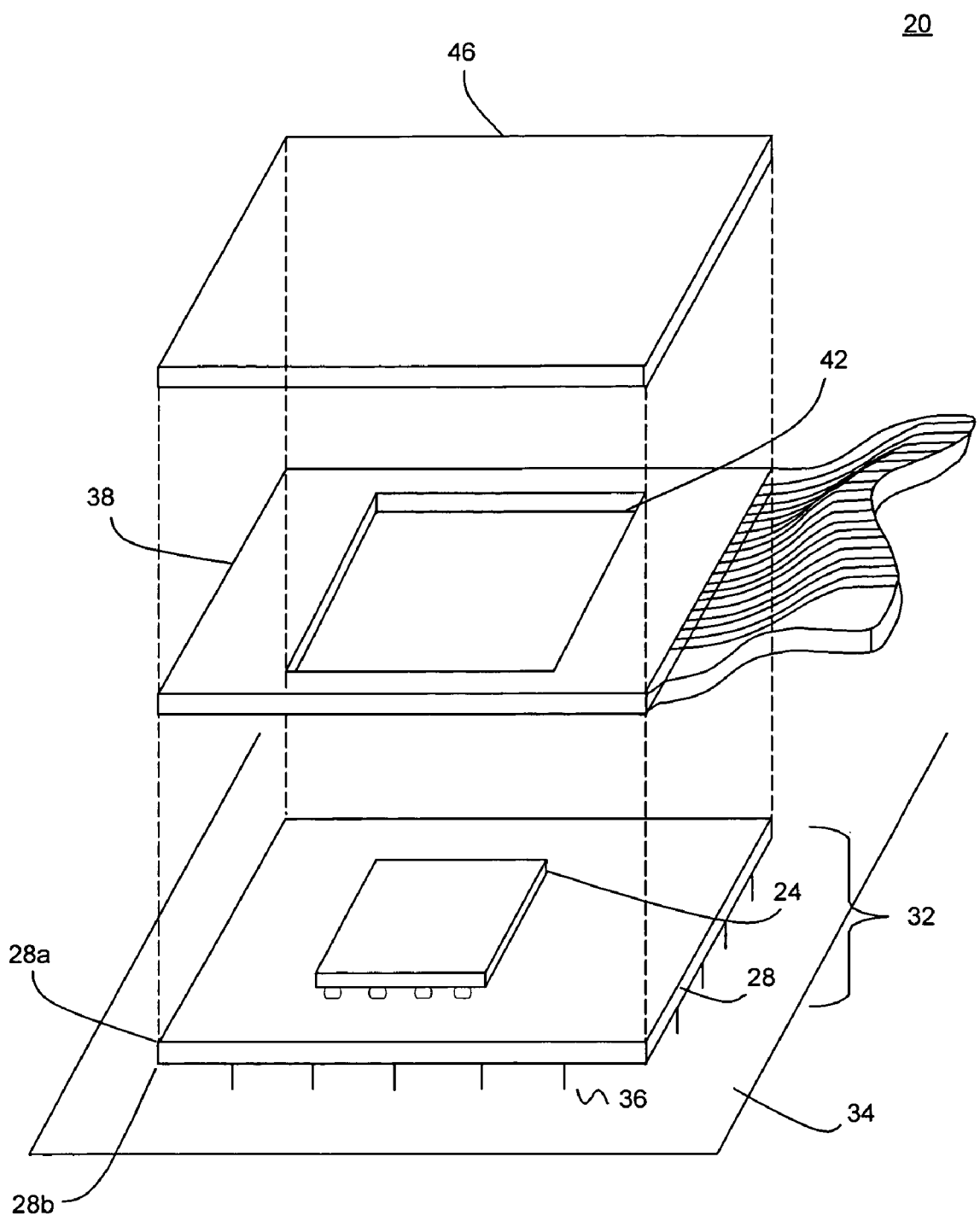
FIG. 1 illustrates an exploded view of an integrated circuit package with a chip-side connector in accordance with an embodiment of this invention.

FIG. 1 illustrates an exploded view of an integrated circuit package 20 with a chip-side connector 38 in accordance with one embodiment of this invention. In this embodiment a processing node 24 is connected to a package structure 28. The processing node 24 could include an integrated circuit, which is typically formed in a rectangular piece of semiconductor material called a chip or a die. Examples of such semiconductor material may include, but are not limited to silicon, silicon on sapphire, silicon germanium, and gallium arsenide. The processing node 24 could contain one or more chips attached to the package structure 28 for support, to interconnect multiple components, and/or to facilitate electrical connections with other components. The package structure 28 may have a first surface 28a and a second surface 28b. The processing node 24 combined with the package structure 28 may together be referred to as a first-level package 32.

Often such first-level packages 32 are connected to a board 34 in order to interconnect multiple components such as, e.g., high-power resistors, mechanical switches, and capacitors, which are not readily placed onto the package structure 28. The board 34 may represent a carrier, a printed circuit board (PCB), a printed circuit card (PCC), or a motherboard. Board materials could include, but are not limited to ceramic (thick-filmed, co-fired, or thin-filmed), plastic, and glass. The first-level packages 32 may be mounted directly onto the board 34 by either solder balls or a pin/socket connection 36.

In one embodiment, a substantially flat chip-side connector 38 with a processing node cavity 42 is placed on the package structure 28 so as to substantially surround the processing node 24. In various embodiments, the cavity 42 may be slightly larger than the processing node 24 to accommodate for expansion/contraction during thermal cycling. An integrated heat spreader 46 may be placed on top of the chip-side connector 38 to distribute and dissipate heat generated from the processing node 24. A thermal interface material may be placed in a heat conducting relation between the processing node 24 and the heat spreader 46 to improve thermal contact by lowering the thermal resistance in the path between the two. The thermal interface materials may include several classes of materials such as phase change materials, epoxies, greases, and gels. The integrated heat spreader 46 may be attached to the chip-side connector 38 with an adhesive epoxy. In one embodiment, the central, planar surface of the heat spreader 46 extends over the backside of the processing node 24. In an alternative embodiment, the chip-side connector 38 may be an enclosed structure that could also serve the thermal dissipative and protective functions of the heat spreader 46.

In other embodiments, the chip-side connector 38 could be any one of a number of geometrical designs to accommodate for variations in chip orientation, package dimensions, the number of chips on package, etc. Also, in alternate embodiments, the connector need not surround the chip, as depicted by the embodiment in FIG. 1.

Figure 2:
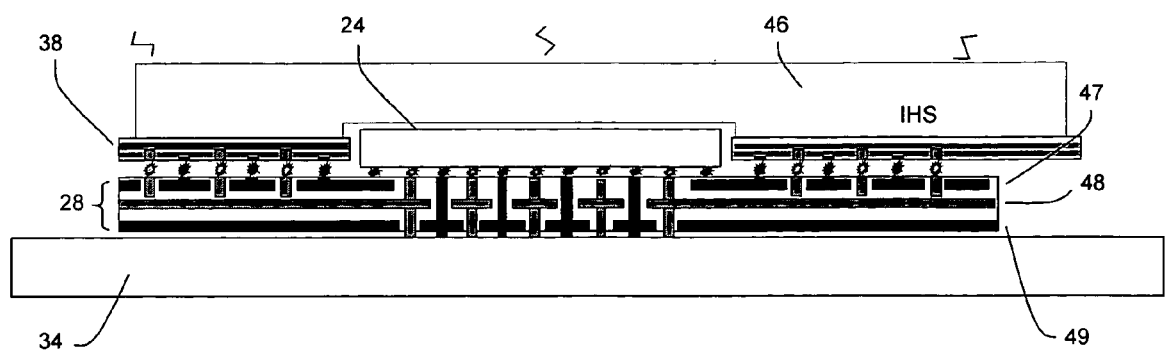
FIG. 2 illustrates a cross-sectional view of an integrated circuit package with a chip-side connector in accordance with an embodiment of this invention.

FIG. 2 illustrates a cross-sectional view of an integrated circuit package 20 in accordance with an embodiment of this invention. The processing node 24 is thermally coupled with the integrated heat spreader 46 and electrically coupled with the package structure 28. High-speed input/output (I/O) signals 47, ground signals 48, and power signals 49 are routed to and from the processing node 24 through electrically conductive paths, called traces, in the package. These traces may be formed by constructing the package structure 28 with alternating layers of conducting and dielectric materials. The terms metal line, trace, wire, conductor, signal path and signaling medium are all related. These related terms are generally interchangeable, and appear in order from specific to general. These traces may be comprised of conductors such as metal (generally aluminum (Al), copper (Cu) or an alloy of Al and Cu), doped polysilicon, doped single-crystal silicon, titanium (Ti), molybdenum (Mo), refractory metal suicides, etc.

The package structure 28 may contain several signal layers that are each associated with a particular type of signal. Each signal layer is made up of individual traces that are of various lengths, widths, spacings and paths, rather than simply being a sheet of conducting material. In one embodiment, a top signal layer of the package structure may be reserved for the high-speed I/O signals 47, while the power signals 49 may be routed from the board 34 to the processing node 24 through a bottom signal layer. The chip-side connector 38 may then route the I/O signals 47 to another processing node, or alternatively it could tap into a bus located in the board 34. Decoupling the signals in this manner could reduce the congestion caused by routing all of the signals through all of the layers of the package structure 28.

A reduction in the congestion of the signals could potentially reduce interference caused by, e.g., inductance and/or transient current effects. This type of interference may deteriorate the signal integrity by causing crosstalk, latencies, and impedance mismatch. Additional potential benefits of embodiments of the current invention could include allowing more I/O connections, faster operating clock frequencies and supply of clean power with low cost and high performance, high functionality and high reliability.

In one embodiment, the I/O signals 47 may be completely decoupled from the power signals 49. Alternative embodiments could decrease the amount of I/O signals 47 traveling vertically through the package structure 28 and into the board 34 by sending only a portion of the I/O signals 47 through the chip-side connector 38.

In another embodiment, the power signals 49 could be delivered through the chip-side connector 38. This could allow the I/O signals 47 to occupy the entire lower layer of the package 28, thereby potentially reducing the interference similar to the above embodiment.

Figure 3:
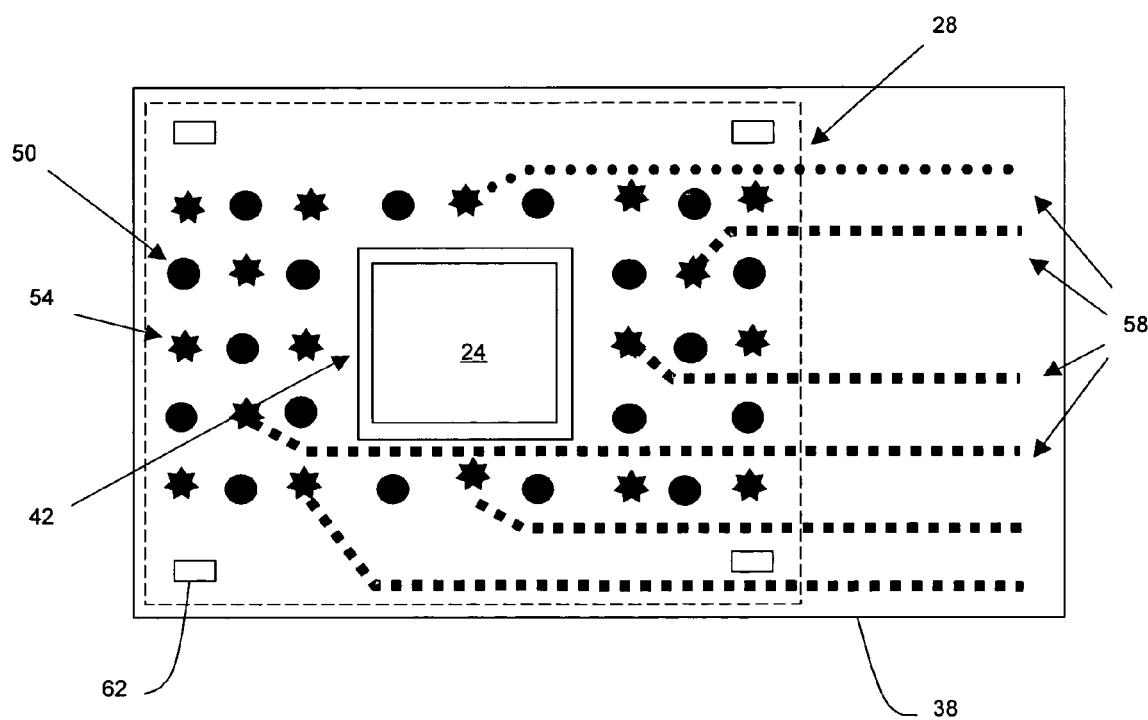
FIG. 3 illustrates a top view of an integrated circuit package with a chip-side connector attached, in accordance with one embodiment of this invention.

FIG. 3 illustrates a top view of the chip-side connector 38 attached to the package structure 28 in accordance with one embodiment of this invention. In an embodiment, the I/O signals are routed out from underneath the processing node 24 to the periphery of the package structure 28. High-speed I/O signals 54 and ground connections 50 may be made from the package structure 28 to the chip-side connector 38. In the illustrated embodiment, the I/O signals 54 may travel through signal traces 58 in the chip-side connector 38.

Electrical connections between the package structure 28 and the chip-side connector 38 may be made anywhere along the exposed portion of the package structure 28 (e.g., the portion not covered by the processing node 24). In embodiments where one chip is centered in the middle of the package 28, this exposed portion may be located around the periphery. Utilizing this area may make it possible to accommodate a high number of I/O connections while experiencing reduced signal interference.

In one embodiment, the electrical connections between the package structure 28 and the chip-side connector 38 may be made by using solder bumps. Solder bumps of similar composition and dimensions as those used to connect the processing node to the package structure may be used. These types of bumps are often referred to as controlled collapse chip connection (C4) bumps. However, depending on the process timing, the reflow temperature of the solder involved in attaching the chip-side connector 38 to the package structure 28 may need to be lower than the processing node bumps to prevent unintentional reflowing of the C4 bumps. If the chip-attach and the chip-side connector-attach take place simultaneously, then similar solder material may be used in order to consolidate the process steps. Following the solder reflow, it may be desirable to underfill the chip and connector with a dielectric epoxy underfill to provide further support. Examples of other types of electrical connections that may be used include but are not limited to gold dots, lands, and vias.

These electrical connections may also serve to mechanically couple the chip-side connector 38 to the package structure 28. However, if it is desired, a mechanical connection could be reinforced with other connectors, such as placing one or more pins 62 in the corners of the chip-side connector 38.

The chip-side connector 38 may be constructed of any type of material that is capable providing/routing discrete signal traces 58. It may be desirable to use a material similar to the material used for the package structure 28. Although the chip-side connector 38 does not provide support to the processing node 24, and therefore does not need similar rigidity as the package structure 28, using materials with similar coefficients of thermal expansion may decrease the amount of stress transmitted to the electrical connections as the integrated circuit package 20 goes through thermal cycling.

Figure 4:
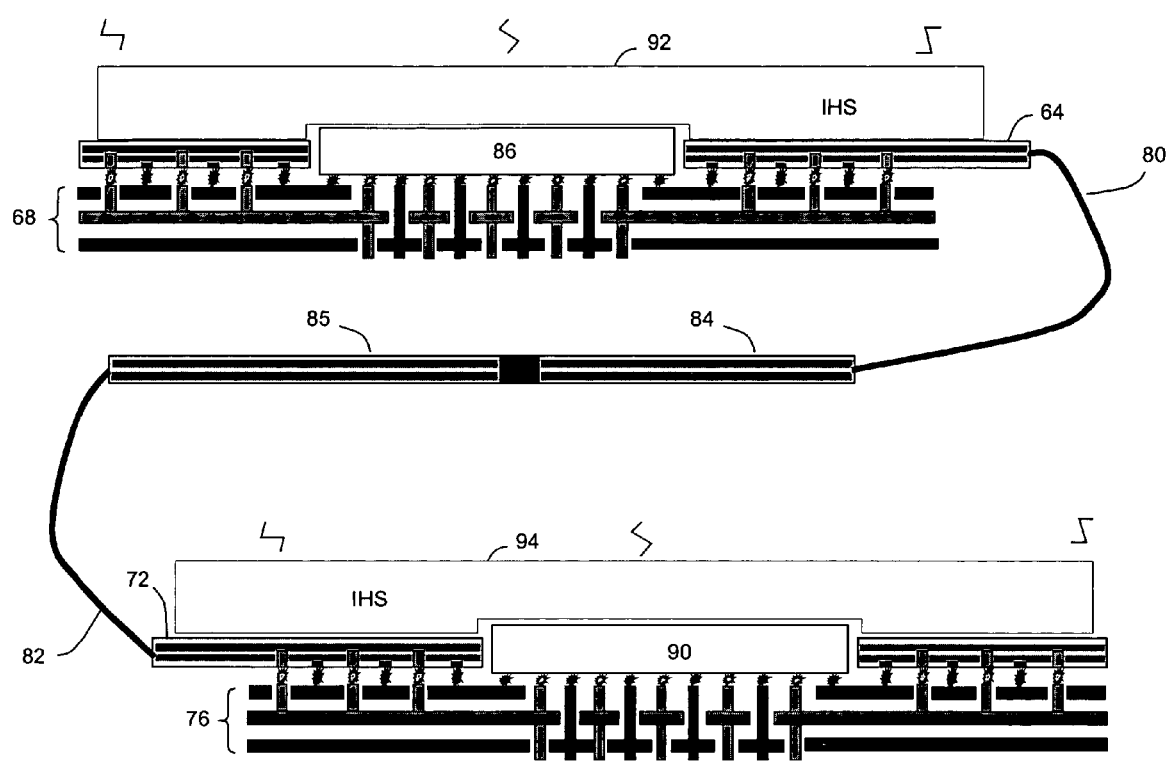
FIG. 4 shows a cross-sectional view of a flex circuit interconnection in accordance with an embodiment of this invention.

FIG. 4 shows a cross-sectional view of a processing node interconnection in accordance with one embodiment of this invention. A first chip-side connector 64, similar to the chip-side connector 38 in FIG. 3, is connected to a first package structure 68. A second chip-side connector 72 is connected to a second package structure 76. Integrated heat spreaders 92 and 94 are placed over the respective processing nodes 86 and 90 and attached to the chip-side connectors 64 and 72. A flex circuit may be used to couple the two chip-side connectors together. The flex circuit could include first and second flex cables 80 and 82 extending from each of the respective chip-side connectors 64 and 72 ending in flex-cable interconnects 84 and 85. These interconnects 84 and 85 are coupled together such that the first die 86 and the second die 90 are electrically coupled to one another. In an alternative embodiment, the first flex-cable interconnect 84 may be attached directly to the second chip-side connector 72. In another embodiment the flex-cable interconnect 84 could be coupled to the second processing node 90 through a bus (not shown). In yet another embodiment the chip-side connectors may be adapted to be coupled directly to one another.

A number of different devices may be used to construct the module interconnects 84 and 85, as long as they provide a secure mechanical and electrical connection between the two flex cables 80 and 82. The coupling between the two flex cables may be permanent; however, it may also be desirable to make them detachable in case one of the chips needs to be upgraded or otherwise replaced. This could provide a scalable, modular, and upgradeable system.

Figure 5:
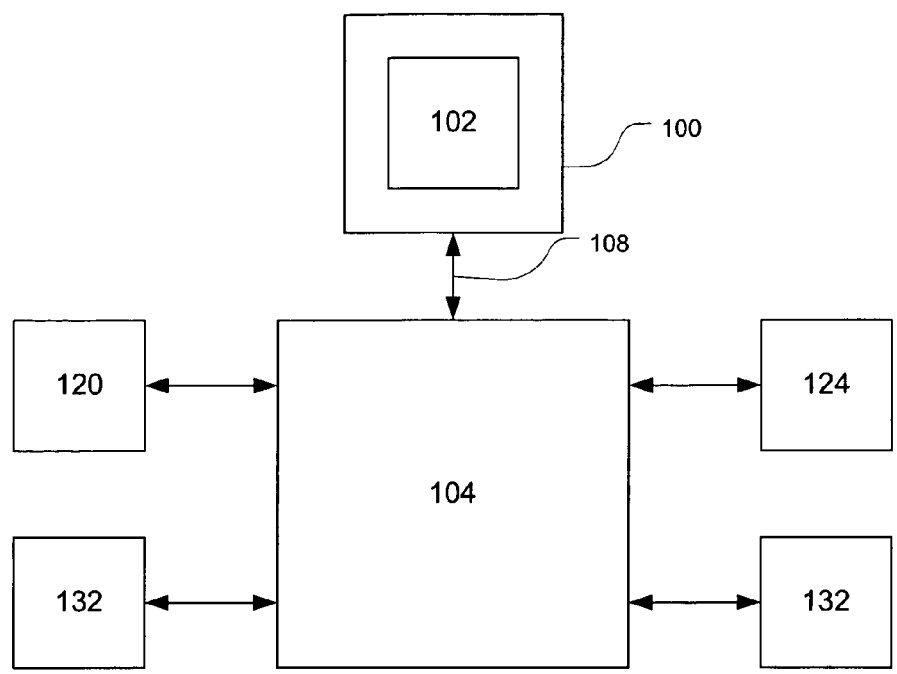
FIG. 5 depicts a block diagram of a system including an integrated circuit package, in accordance with an embodiment of the present invention.

FIG. 5 shows an example of a system employing an integrated circuit package 100 in accordance with an embodiment of this invention. In one embodiment the integrated circuit package 100 could include a processing node such as a microprocessor 102. The microprocessor 102 could include a control unit, an arithmetic logic unit, and memory (registers, caches, RAM, and ROM) as well as various temporary buffers and other logic. In alternative embodiments the integrated circuit package may include an application specific integrated circuit (ASIC), stacked or multi-chip modules, digital signal processors, etc.

In one embodiment a processing node such as a chipset 104 could act as a hub chipset, or an intermediary, between the microprocessor 102 and other components operating in the system. The integrated circuit package 100 could be coupled to the hub chipset 104 by using a flex circuit cable 108 similar to the one described with reference to FIG. 4, or by some other means.

In one embodiment the hub chipset 104 may arbitrate data and processing requests between the microprocessor 102 and the graphics processor 120, memory 124, mass storage device 128, and/or other I/O modules 132. Examples of the memory 124 include but are not limited to static random access memory (SRAM) and dynamic random access memory (DRAM). Examples of the mass storage device 128 include but are not limited to a hard disk drive, a compact disk drive (CD), a digital versatile disk drive (DVD), and so forth. Examples of the input/output modules 132 include but are not limited to a keyboard, cursor control devices, a display, a network interface, and so forth. In various embodiments, the system may be a wireless mobile phone, a personal digital assistant, a pocket PC, a tablet PC, a notebook PC, a desktop computer, a set-top box, an audio/video controller, a DVD player, and a server.

The hub chipset 104 may communicate with the system components over other flex connectors or one or more buses such as, but not limited to, a peripheral control interface (PCI) bus, an industry standard architecture (ISA) bus, a universal serial bus (USB), and so forth.

Figure 6:
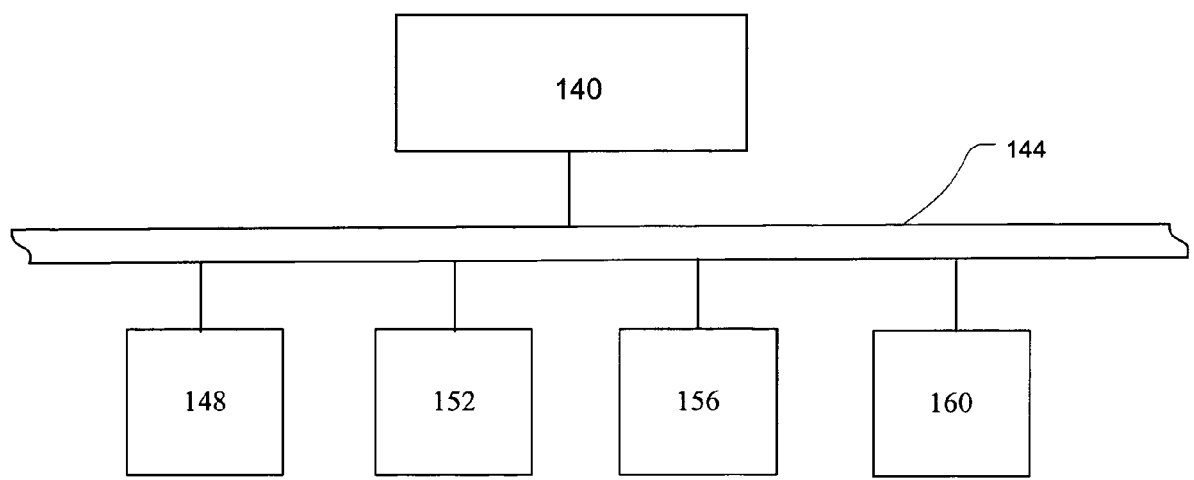
FIG. 6 depicts a block diagram of a system including an integrated circuit package, in accordance with one embodiment of this invention.

Referring to FIG. 6, there is illustrated another of the many possible systems in which embodiments of the present invention may be used. This embodiment contains components similar to those discussed in FIG. 5. However, in this embodiment the integrated circuit package 140 is connected to a bus 144. The other components of the system, for example, the graphics processor 148, the memory 152, the mass storage device 156, and other I/O modules 160, may be coupled to the integrated circuit package 140 by being either directly or indirectly coupled to the bus 144. Otherwise the functionality and interactions will be substantially similar to the preceding embodiment.

Thus, it can be seen from the above descriptions, a novel approach for an integrated circuit package has been described.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the above embodiments without departing from the scope of the present invention. Those with skill in the art will readily appreciate that the present invention may be implemented in a wide variety of embodiments. This application is intended to cover any adaptations or variations of the embodiments discussed herein. Therefore, it is manifestly intended that this invention be limited only by the claims and the equivalents thereof.

What is claimed is:

1. An apparatus comprising
   a processing node;
   a package structure, having a first portion of a first surface coupled to the processing node, and a first layer to route input signals to the processing node at the first portion from a second portion of the surface of the package structure and to route output signals from the processing node at the first portion to the second portion of the first surface, and a second layer to route power to the processing node from a second suface of the package structure;
   a chip-side connector having a cavity and coupled to the second portion of the first surface such that the processing node is disposed within the cavity, the chip-side connector to provide the input signals to the first surface and receive the output signals from the first surface; and
   a flex circuit, including a flex cable, coupled to the chip-side connector, to communicate signals with the processing node.

2. The apparatus of claim 1, wherein the processing node includes a microprocessor.

3. The apparatus of claim 1, wherein the chip-side connector is coupled to the package structure by at least a selected one of a via, a solder bump, a gold dot, and a land.

4. The apparatus of claim 1, wherein the second portion of the package structure substantially surrounds the first portion.

5. The apparatus of claim 1, wherein the cavity is slightly larger than the processing node to accommodate for thermal cycling of the apparatus.

6. The apparatus of claim 1, further comprising
   a heat spreader mechanically coupled to the chip-side connector and thermally coupled to the processing node.

7. The apparatus of claim 6, wherein the heat spreader is mechanically coupled to the chip-side connector by an adhesive epoxy.

8. The apparatus of claim 1, wherein the package structure, the processing node, and the chip-side connector form a first integrated circuit package, and the apparatus further comprises a second integrated circuit package with a chip-side connector coupled to the chip-side connector of the first integrated circuit package.

9. The apparatus of claim 8, wherein the flex circuit is coupled to the chip-side connector of the second integrated circuit package.

10. The apparatus of claim 8, wherein the second integrated circuit package includes a chipset.

11. The apparatus of claim 1, wherein the first layer is at or near the first surface.

* * * * *

UNITED STATES PATENT AND TRADEMARK OFFICE
CERTIFICATE OF CORRECTION

PATENT NO. : 7,345,359 B2 Page 1 of 1
APPLICATION NO. : 10/795072
DATED : March 18, 2008
INVENTOR(S) : Joon-Ho Kim et al.

It is certified that error appears in the above-identified patent and that said Letters Patent is hereby corrected as shown below:

Column 6
Line 7, "...of the surface..." should read --...of the first surface...--.

Signed and Sealed this

Eleventh Day of August, 2009

David J. Kappos
*Director of the United States Patent and Trademark Office*